United States Patent [19]
Charneski et al.

[11] Patent Number: 5,909,637
[45] Date of Patent: Jun. 1, 1999

[54] COPPER ADHESION TO A DIFFUSION BARRIER SURFACE AND METHOD FOR SAME

[75] Inventors: Lawrence J. Charneski; Tue Nguyen, both of Vancouver, Wash.

[73] Assignees: Sharp Microelectronics Technology, Inc., Camas, Wash.; Sharp Kabushiki Kaisha, Osaka, Japan

[21] Appl. No.: 08/717,315

[22] Filed: Sep. 20, 1996

[51] Int. Cl.$^6$ ............................................ H01L 21/443
[52] U.S. Cl. .................... 438/687; 438/677; 438/674
[58] Field of Search ............................. 438/687, 685, 438/648, 677, 674, 798

[56] References Cited

U.S. PATENT DOCUMENTS

| | | | |
|---|---|---|---|
| 5,240,879 | 8/1993 | De Bruin | 437/190 |
| 5,429,987 | 7/1995 | Allen | 437/187 |
| 5,605,724 | 2/1997 | Hong et al. | |
| 5,712,193 | 1/1998 | Hower et al. | |
| 5,843,843 | 12/1998 | Lee et al. | 438/688 |

FOREIGN PATENT DOCUMENTS 4-030425  1/1992  Japan .

OTHER PUBLICATIONS

Article entitled "Chemical Mechanical Polishing of Copper Metallized Multilevel Interconnect Devices" presented at the 1995 Proceedings—12$^{th}$ International VLSI Multilevel Interconnection Donference (VMIC), Jun. 27–29, 1995, Santa Clara, CA, Catalog No. 95ISMIC—104—pp. 505–507.

Article entitled "Copper Interconnection with Tungsten Cladding for ULSI" presented at the 1991 Symposium on VLSI Technology, Digest of Technical Papers, May 28–30, 1991, pp. 37–40.

Article entitled Encapsulated Copper Interconnection Devices Using Sidewall Barriers, presented at the 1991 VMIC Conference, Jun. 11–12, 1991, pp. 99–108.

*Primary Examiner*—Caridad Everhart
*Attorney, Agent, or Firm*—Gerald Maliszewski; David C. Ripma

[57] ABSTRACT

A method has been provided for improving the adhesion of Cu to a diffusion barrier material, such as TiN, in an integrated circuit substrate. The diffusion barrier material is exposed to either a reactive gas species, or a plasma containing a reactive gas. By removing contaminants on the surface of the diffusion barrier, and forming weak molecular bonds between the diffusion barrier surface and the reactive gas, the diffusion barrier surface is protected and prepared for Cu adhesion. Cu, breaking the bonds between the reactive gas and diffusion barrier surface, readily bonds to the diffusion material for improved adhesion between surfaces. The diffusion barrier surface, prepared with the reactive gas, allows the IC to be stored, delaying the Cu deposition to more convenient times in the IC fabrication process. An Cu conductor interface adhered to the diffusion barrier of an integrated circuit is also provided.

12 Claims, 2 Drawing Sheets

COPPER ADHESION TO A DIFFUSION BARRIER SURFACE AND METHOD FOR SAME

This invention relates generally to integrated circuit processes and fabrication, and more particularly, to a system and method of adhering copper to a diffusion barrier surface.

The demand for progressively smaller, less expensive, and more powerful electronic products, in turn, fuels the need for smaller geometry integrated circuits (ICs), and large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different resistivity characteristics.

There is a need for interconnects and vias to have both low resistivity, and the ability to withstand volatile process environments. Aluminum and tungsten metals are often used in the production of integrated circuits for making interconnections or vias between electrically active areas. These metals are popular because they are easy to use in a production environment, unlike copper which requires special handling.

Copper is a natural choice to replace aluminum in the effort to reduce the size of lines and vias in an electrical circuit. The conductivity of copper is approximately twice that of aluminum and over three times that of tungsten. As a result, the same current can be carried through a copper line having half the width of an aluminum line.

The electromigration characteristics of copper are also much superior to those of aluminum. Copper is approximately ten times better than aluminum with respect to electromigration. As a result, a copper line, even one having a much smaller cross-section than an aluminum line, is better able to maintain electrical integrity.

There have been problems associated with the use of copper, however, in IC processing. Copper pollutes many of the materials used in IC processes and, therefore, care must be taken to keep copper from migrating. The migration of copper into silicon semiconductor regions is especially harmful. The conduction characteristics of the semiconductor regions are a consideration in the design of a transistors. Typically, the fabrication process is carefully controlled to produce semiconductor regions in accordance with the design. Elements of copper migrating into these semiconductor regions can dramatically alter the conduction characteristics of associated transistors.

Various means have been suggested to deal with the problem of copper diffusion into integrated circuit material. Several materials, especially metallic ones, have been suggested for use as barriers to prevent the copper diffusion process. For example, Cho et al., in the article entitled "Copper Interconnection with Tungsten Cladding for ULSI," 1991 Symposium on VLSI Technology, pg. 39, suggests the use of tungsten as a diffusion barrier. Molybdenum and titanium nitride (TiN) have also been suggested for use as copper diffusion barriers. Gardner, et al., in an article entitled "Encapsulated Copper Interconnection Devices Using Sidewall Barriers," in 1991 VMIC Conference, pg. 99, suggests the use of sidewall structures to completely encapsulate the copper. However, the adhesion of copper to these diffusion barrier materials has been, and continues to be, an IC process problem.

Copper cannot be deposited onto substrates using the conventional processes for the deposition of aluminum when the geometries of the selected IC features are small. That is, new deposition processes have been developed for use with copper in the lines and interconnects of an IC interlevel dielectric. It is impractical to sputter metal, either aluminum or copper, to fill small diameter vias, since the gap filling capability is poor. To deposit copper, a chemical vapor deposition (CVD) technique has been developed in the industry.

In a typical CVD process, copper is combined with a ligand, or organic compound, to make the copper volatile. That is, copper becomes an element in a compound that is vaporized into a gas. Selected surfaces of an integrated circuit, such as diffusion barrier material, are exposed to the copper gas in an elevated temperature environment. When the copper gas compound decomposes, copper is left behind on the selected surface. Several copper gas compounds are available for use with the CVD process. It is generally accepted that the configuration of the copper gas compound, at least partially, affects the ability the copper residue to adhere itself to the selected surface.

Wang, et al. in the article "Chemical Mechanical Polishing of Copper Metalized Multi-level Interconnection Devices," 1995 VMIC Conference, pg. 505, suggests the use of one particular copper gas compound, or precursor, for improving the adhesion of copper to a TiN barrier surface. Although certain precursors may improve the copper adhesion process, variations in the diffusion barrier surfaces to which the copper is applied, and variations in the copper precursors themselves, often result in the unsatisfactory adhesion of copper to a selected surface.

It has become standard practice in the industry to apply CVD copper immediately after the deposition of the diffusion barrier material to the IC. Typically, the processes are performed in a single chamber or an interconnected cluster chamber. It has generally been thought that the copper layer has the best chance of adhering to the diffusion barrier material when the diffusion barrier material surface is clean. Hence, the diffusion barrier surface is often kept in a vacuum, or controlled environment, and the copper is deposited on the diffusion barrier as quickly as possible. However, even when copper is immediately applied to the diffusion barrier surface, problems remain in keeping the copper properly adhered. A complete understanding of why copper does not always adhere directly to a diffusion barrier surface is lacking.

It would be advantageous to employ a method of improving the adhesion of CVD copper to a diffusion barrier material surface.

It would also be advantageous if a method were employed for preparing a diffusion barrier surface, in advance of CVD copper deposition, to improve the adhesion of copper of the diffusion barrier surface.

Further, it would be advantageous if the adhesion improving process did not degrade the electrical conductivity between the deposited copper and a conductive diffusion barrier material. It would also be advantageous if the process did not disrupt the silicon bonds and structures in adjoining IC substrates.

Accordingly, a method of applying copper to selected integrated circuit surfaces is provided. The selected copper-receiving surfaces being predominantly on diffusion barrier material applied to selected regions of the IC. The method comprises the steps of: exposing each selected copper-receiving surface to a reactive gas species; permitting the reactive gas species to interact with molecules of the copper-receiving surface, whereby higher energy molecular bonds are replaced with lower energy bonds between the reactive gas species and the exposed copper-receiving surface, changing the surface characteristics of the exposed copper-receiving surface to promote the formation of bonds between the copper-receiving surface and subsequently deposited copper; and depositing CVD copper on the copper-receiving surface, whereby copper adhesion to the diffusion barrier is improved.

In a preferred embodiment of the invention, the method includes generating the reactive gas species from a plasma source. The method also includes using a direct plasma source having a radio frequency (RF) power level of less than approximately 500 watts to generate the reactive gas species, whereby the relatively low energy level of the plasma ions minimizes the disruption of silicon crystalline structures.

It is a feature of the invention that the reactive gas species is selected from the group consisting of $O_2$, $H_2$, $N_2$, Ar, He, Ne, Kr, Xe, and volatile C compounds. The volatile C compound is selected from the group consisting of CO, $CH_4$, $C_2H_6$, $C_2F_6$, $C_3F_8$, $C_4F_8$, $CHF_3$, $CH_3F$, and $CF_4$.

In a preferred embodiment of the invention the diffusion barrier material is selected from the group consisting of TiN, TiON, TiSiN, TaSiN, TaN, TiW, TiWN, Mo, and WN, whereby copper is adhered to a copper-receiving surface which permits electrical communication between the copper and regions of the IC underlying the copper-receiving surface. It is also a feature of the invention that the diffusion barrier material is selected from the group consisting of BN, $Si_3N_4$, and SiBN, whereby copper is adhered to an electrically insulating copper-receiving surface.

An adherent copper conductor interface on an integrated circuit is also provided, comprising a semiconductor layer, and a copper layer overlying the semiconductor layer. The adherent copper conductor interface also comprises a diffusion barrier between the semiconductor layer and the copper layer with a surface adjoining the copper layer, the diffusion barrier surface being exposed to a reactive gas species to permit the reactive gas species to interact with molecules of the diffusion barrier surface, changing the surface characteristics of the exposed diffusion barrier surface to promote the formation of bonds between the exposed diffusion barrier surface and the subsequently deposited copper layer.

In a preferred embodiment of the invention the diffusion barrier is TiN. It is a feature of the invention that the diffusion barrier surface is prepared for adhesion to the copper layer with a reactive hydrogen species. Typically, the reactive hydrogen species is generated from a plasma source.

A co-pending application Ser. No. 08/717,267, filed Sep. 20, 1996, entitled, "Oxidized Diffusion Barrier Surface for the Adherence of Copper and Method for Same", invented by Tue Nguyen, Lawrence J. Charneski, and Lynn R. Allen, Docket No. SMT 123, which is assigned to the same assignees as the instant patent, discloses a method for oxidizing the diffusion barrier surface to improve the adherence of copper to the diffusion barrier.

It has been standard practice in the industry to keep a diffusion barrier surface, located on a selected surface of an IC, in a controlled environment whenever possible, and to apply the copper as quickly as possible. This practice is based on the belief that protecting the diffusion barrier from uncontrolled gas environments, and keeping the barrier clean, provides the best foundation for copper adhesion. However, as demonstrated in the present invention, the preparation of the copper-receiving surface with a reactive gas species prepares the copper-receiving surface to adhesion to a copper layer by roughing the surface to increase the total area of the surface available for bonding to the copper. In addition, elements of the diffusion barrier surface bond to the reactive gas species. These bonds are replaced, relatively easily, by copper so that bonds to the diffusion barrier surface are formed, improving adhesion. Alternately, the reactive gas species disrupts molecular bonding along the surface of the diffusion barrier creating high energy, unstable, bonds. Copper deposited on the diffusion barrier surface breaks these unstable bonds to form stable bonds to the diffusion barrier surface, which improves copper adhesion.

The low power levels and temperatures required to perform this process ensure that minimum damage is done to the associated substrates in the integrated circuit. Since the plasma exposure process is generally completed in less than 60 seconds, a minimum of damages done to the IC crystalline structures and a speedy, commercially viable, process is ensured. The improved adhesion resulting from exposure to a reactive gas species permits a greater degree of variation in the uniformity of the diffusion barrier surface and the precursor. Further, the diffusion barrier deposition process and the copper deposition processes can be carried out in different chambers, and at different times, because of the reduced concern over the cleanliness of the process diffusion barrier surface.

DETAILED DESCRIPTION OF THE PREFERRED EMBODIMENT

Figure 1:
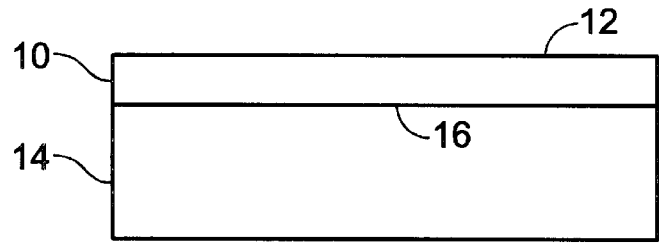
FIGS. 1 through 4 illustrate steps in the method of forming a completed adherent copper conductor interface on an integrated circuit.

FIGS. 1 through 4 illustrate steps in the method of forming a completed adherent copper conductor interface on an integrated circuit. FIG. 1 illustrates an integrated circuit having a substrate layer of diffusion barrier material 10. Diffusion barrier 10 has a surface 12 for receiving copper. The IC also comprises a semiconductor layer 14 having a surface 16 underlying diffusion barrier layer 10. Diffusion barrier material 10 is applied to selected areas of the IC to prevent the migration of copper into semiconductor layer 14.

Figure 2:
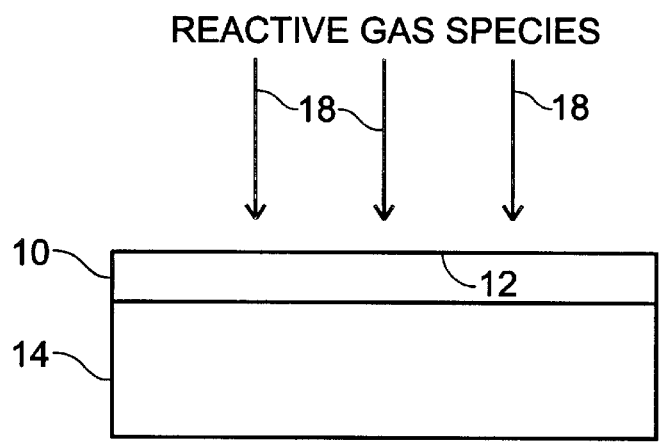

FIG. 2 is the IC of FIG. 1 with copper-receiving surface 12 being exposed to a reactive gas species. The reactive gas exposure is represented by arrows 18. Diffusion barrier surface 12 is exposed to reactive gas species 18 to permit reactive gas species 18 to interact with molecules of diffusion barrier surface 12.

Figure 3:
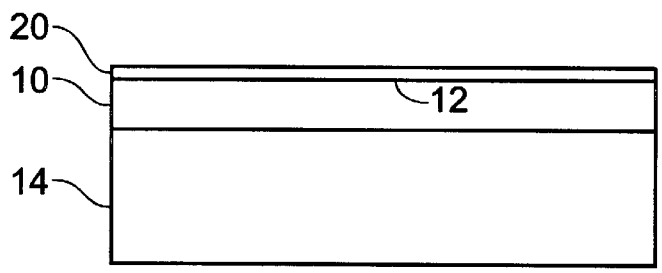

FIG. 3 is the integrated circuit of FIG. 2 with the section of diffusion barrier surface 12 that has been exposed to reactive gas 18 represented with reference designator 20. In response to exposure to reactive gas species 18, the surface characteristics of exposed diffusion barrier surface 20 are changed to promote the formation of bonds between exposed diffusion barrier surface 20 and a subsequently deposited copper layer.

Figure 4:
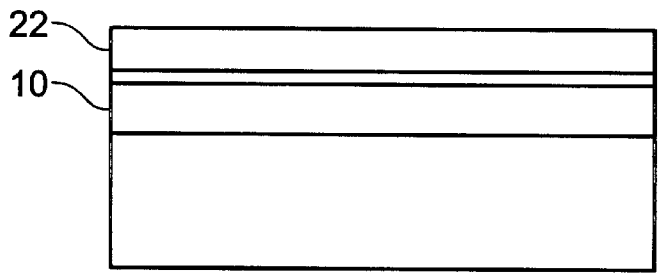

FIG. 4 is the integrated circuit of FIG. 3 with a layer of copper 22. The adherent copper conductor interface on an integrated circuit, therefore, comprises semiconductor layer 14, copper layer 22 overlying semiconductor layer 14, and diffusion barrier 10 between semiconductor layer 14 and copper layer 22 with a surface 20 adjoining copper layer 22.

In a preferred embodiment, diffusion barrier 10 is TiN. It is a feature of the invention that diffusion barrier surface 12 is prepared for adhesion to copper layer 22 with a reactive hydrogen species 18. In a preferred embodiment, reactive hydrogen species 18 is generated from the plasma source.

Typically, copper layer 22 is deposited to form an electrical interface to semiconductor layer 14 when semiconductor layer 14 is a transistor semiconductor region. Depositing copper layer 22 directly upon substrate 14 would allow copper to migrate into the semiconductor material, altering its intended conduction characteristics. Diffusion material 10, located between copper layer 22 and semiconductor layer 14, prevents the diffusion of copper into semiconductor layer 14. When diffusion material 10 is conductive, such as TiN, electrical communication between copper layer 22 and semiconductor layer 14 is maintained as semiconductor layer 14 is protected from copper diffusion. In this manner, safe and effective electrical interfaces are made between copper lines and vias to silicon semiconductor material.

Figure 5:
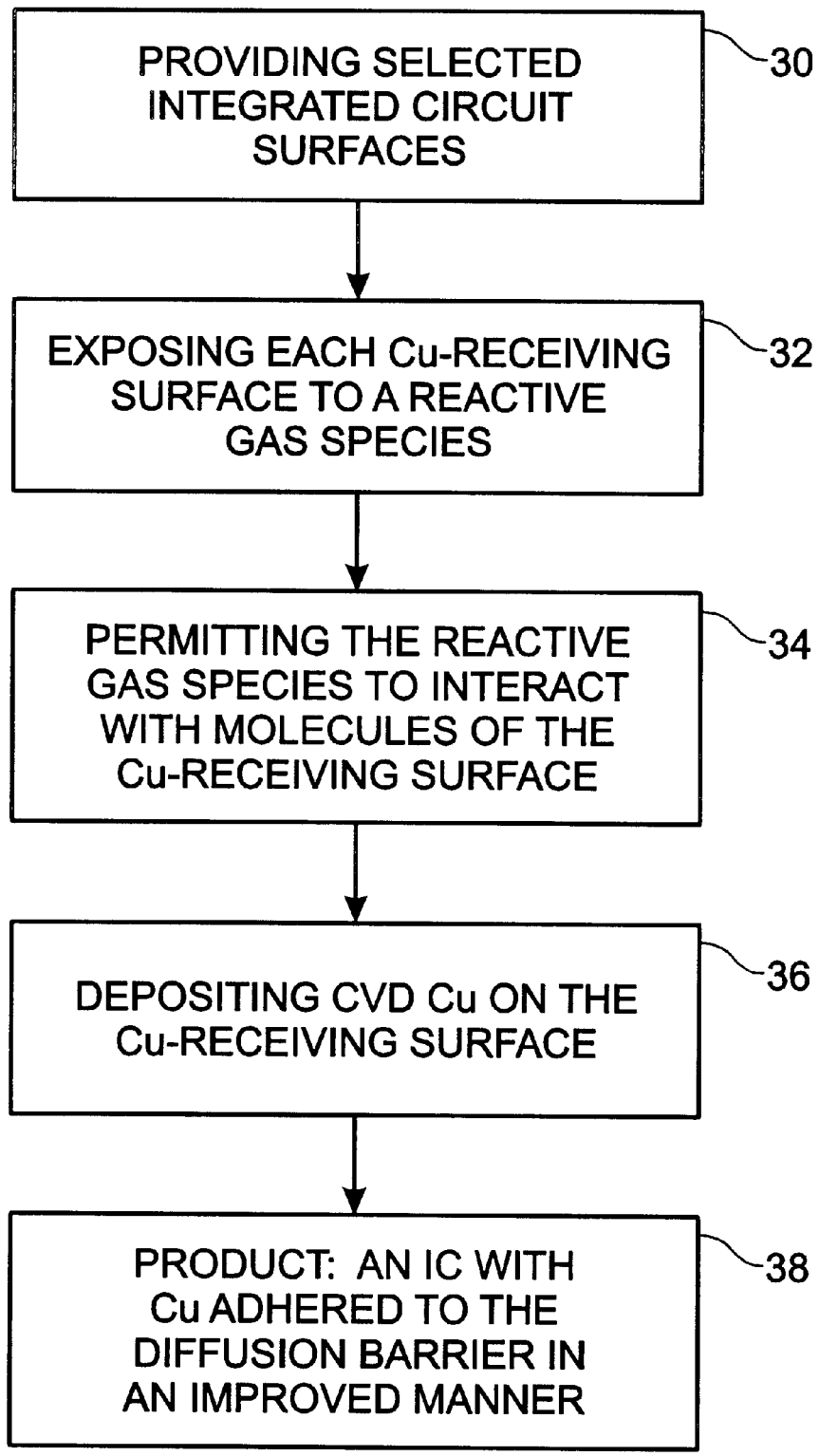
FIG. 5 is a flow chart illustrating the steps in the method of applying copper to a selected receiving surface of an integrated circuit.

FIG. 5 is a flow chart illustrating the steps in the method of applying copper to selected integrated circuit surfaces. Step 30 provides selected integrated circuit surfaces, the selected copper-receiving surfaces being predominately on diffusion barrier material applied to selected regions of the IC. Step 32 exposes each selected copper-receiving surface to a reactive gas species. A reactive gas species contains gas in a form that is likely to combine with other atoms. For example, the single atom of some gases has unattached electrons. Alternately, some gases are created in an ionized form, with unbalanced electrical charges, and are, therefore, reactive. Atomic, or reactive, gas species are produced as a result of molecular disassociation caused by electron impacts. Atomic, or reactive, gases readily combine with the metal atoms of a diffusion barrier material at relatively low temperatures. In this manner, hydroxyl groups containing OH compounds, that impede the adhesion of copper to the diffusion barrier surface, are replaced on the diffusion barrier surface with the reactive gas species. In one preferred embodiment, the reactive gas species is a reactive hydrogen species.

Step 34 permits the reactive gas species to interact with molecules of the copper-receiving surface, whereby higher energy molecular bonds are replaced with lower energy bonds between the reactive gas species and the exposed copper-receiving surface, changing the surface characteristics of the exposed copper-receiving surface to promote the formation of bonds between the copper-receiving surface and a subsequently deposited copper layer. Alternately, adhesion is improved due to the disruption of the network of chemical bonds along the surface of the copper-receiving surface. By disrupting the relatively stable bonds in the diffusion material, for example, between Ti and N molecules, a high energy (unstable) bond between Ti molecules is created. As copper is deposited, it combines with Ti to form a lower energy (stable) compound.

Step 36 deposits CVD copper on the copper-receiving surface exposed in Step 32, whereby copper adhesion to the diffusion barrier is improved. Unattached copper atoms, from the CVD precursor, are readily able to break the relatively weak bonds between the reactive gas species and the diffusion barrier surface. The copper then forms bonds with the copper and the diffusion barrier surface to improve adhesion.

Step 38 is a product, an IC with copper adhered to the diffusion barrier in an improved manner.

It is a feature of the invention that Step 32 includes generating the reactive gas species from a plasma source. In one preferred embodiment the selected copper-receiving surface is exposed to a $H_2$ plasma. Alternately, the reactive hydrogen species is generated from a plasma source. Plasma is used in many commercially prevalent forms anisotropic etching. Ashing, or plasma etching, is performed in a chamber where an atmosphere of a relatively inert gas is introduced. The pressure of the gas and the pumping rates are controlled. A voltage across the chamber, at a predetermined frequency, is created to establish a flow of ions in a known direction. In addition, temperature of the substrate, and the time of the exposure to the ion flow, are controlled. As a consequence of the radio frequency voltage in the chamber, the relatively inert gas is transformed into a plasma consisting of unstable and, therefore, reactive radicals.

In a preferred embodiment of the invention, Step 32 includes exposing each selected copper-receiving surface to an ionized reactive gas. Step 32 also includes generating the ionized reactive gas from a plasma source. In addition to generating a reactive gas species to perform a chemical process, plasma generation typically involves the physical effects from bombarding the selected IC surface with ions. These bombarding atoms have the potential of transferring their high energy to surface atoms to influence chemical reaction rates. Ion bombardment can damage chemical bonds, and damage single crystalline or polycrystalline structures. Energetic ions can also cause electron or hole trapping in gate oxide, as is well known in the art, that is only removable through annealing processes.

As a plasma etchent, the reactive gas species are typically used to remove materials, such as photoresist from the surface of a substrate. The ions and radicals react with the film layers on the IC wafer to form volatile etch products which are then pumped away from the IC. Contrary to its popular use, plasma is used in the present invention to generate a reactive gas species to bond with molecules of the copper-receiving surface to protect the diffusion barrier surface from hydroxyls, or other contaminates, in the gas environment. The relatively weak bonds between the reactive gas species and the diffusion barrier surface are readily broken when the CVD copper is deposited, enhancing the ability of the copper to adhere to diffusion barrier surface.

In a preferred embodiment, selected regions of the IC also include silicon, and Step 32 includes using a direct plasma source having a power level less than approximately 500 watts to generate the reactive gas species, whereby the relatively low energy level of the plasma ions minimizes the disruption of silicon crystalline structures. The relatively low energy of the plasma ions created by the RF power source minimizes the disruption of silicon crystalline structures. That is, energetic ions produced from such a low level of power are unlikely to damage adjoining silicon IC structures.

In a preferred embodiment of the invention Step 32 is performed at a substrate temperature of less than approximately 200 degrees C. to protect the silicon crystalline structures of the IC. Since the gas species are reactive, the bonding of the gas species to molecules of the copper-receiving surface can be accomplished at a relatively low temperature. Low temperatures help insure that a minimum of damage and stress is done to nearby IC silicon crystalline structures for underlying IC substrates.

It is a feature of the invention to include the further step, following Step 34, of terminating Step 32 generally within a time interval of less than 60 seconds, whereby the silicon crystalline structures of the IC are protected. Once again, because the gas species is reactive, a relatively short process time protects the silicon crystalline structures of the IC.

It is a feature of the invention that the reactive gas species is selected from the group consisting of $O_2$, $H_2$, $N_2$, Ar, He, Ne, Kr, Xe, and volatile C compounds. The volatile C compound is selected from the group consisting of CO, $CH_4$, $C_2H_6$, $C_2F_6$, $C_3F_8$, $C_4F_8$, $CHF_3$, $CH_3F$, and $CF_4$.

In a preferred embodiment, Step 32 includes using $H_2$, and $N_2$ plasma, with the percentage of $H_2$ being generally in the range of 5 to 10 percent of the total volume, whereby the safety of the process step is enhanced with the use of a non-explosive gas mixture.

In a preferred embodiment of the invention the diffusion material is selected from the group consisting of TiN, TiON, TiSiN, TaSiN, TaN, TiW, TiWN, Mo, and WN, whereby copper is adhered to a copper-receiving surface which permits electrical communication between the copper and regions of the IC underlying the copper-receiving surface. Adhesion between copper and a conductive diffusion barrier material is improved, using the present invention, without degrading the electrical conduction between materials. The improvement in adhesion is attained without the necessity of adding an intervening material between the copper and the diffusion barrier surface.

It is a feature of the invention that the diffusion barrier material is selected from a group consisting of BN, $Si_3N_4$, and SiBN, whereby copper is adhered to an electrically insulating copper-receiving surface. A non-conductive diffusion barrier material overlies a nonconductive IC buffer material, such as silicon oxide, when there is a fear that copper will migrate through these IC buffer regions to adjacent semiconductor regions.

It is a feature of the invention that Step 32 includes generating the reactive gas species from a downstream plasma source, whereby high energy ions are removed from the plasma flow to minimize damage to the IC. A downstream plasma source ionizes gas at a site relatively remote from the IC substrate. Baffles, or barriers, located between the plasma source and the IC substrate, remove the high energy ions. Reactive gas species resulting from the generation of plasma are typically moved to the selected IC substrate surfaces through control of the relative pressures between the plasma and IC chambers. The reactive gas species combined with the diffusion barrier surface as a purely chemical process, without energetic ions. Using a downstream plasma source allows the ions to be generated at a high energy without concern that energetic ions will harm the selected IC substrate surface. Therefore, feed gases requiring a large amount of power to generate the reactive gas species are safely used in the present invention when the reactive gas species is generated from a downstream plasma source.

The preparation of the diffusion barrier surface with a reactive gas species results in a diffusion barrier surface having relatively weak molecular bonding to the gas species. These relatively weak molecular bonds are broken as the CVD copper is deposited on the diffusion barrier surface, and the copper bonds to elements of the diffusion barrier surface instead. In addition, the exposure of the diffusion barrier surface to the reactive gas species removes hydroxyl groups which are relatively tightly bound to the diffusion barrier surface. Removing the OH groups also allows the diffusion barrier surface to more easily bond with CVD copper. By protecting the diffusion barrier surface with bonds to the reactive gas species, the present invention reduces the need for strict environmental controls. As a result, copper deposition can be performed in a different chamber from where the diffusion barrier material was deposited. It also allows an IC with diffusion barrier to be stored so that the copper deposition process can be delayed to times more convenient in the IC process. Further, the present invention improves adhesion without the necessity of adding an intervening material between the copper and the diffusion barrier surface which could act to degrade electrical conductivity between the copper and diffusion barrier surface.

The invention has been described above as comprising overlaying layers of copper, exposed diffusion barrier surface, diffusion material, and IC substrate. The present invention is also applicable to the adhesion of copper to sidewall structures, and other copper encapsulating structures. Other variations within the scope of the present invention will occur to those skilled in the art.

What is claimed is:

1. A method of applying Cu to selected integrated circuit (IC) surfaces, the selected Cu-receiving surfaces being predominately on diffusion barrier material applied to selected regions of the IC, wherein the selected regions of the IC also include silicon, the method comprising the steps of:

a) exposing each selected Cu-receiving surface to a reactive gas species generated from a direct plasma source having a RF power level of less than approximately 500 watts, whereby the relatively low energy level of the plasma ions minimizes the disruption of silicon crystalline structures;

b) permitting the reactive gas species to interact with molecules of the Cu-receiving surface, whereby higher energy molecular bonds are replaced with lower energy bonds between the reactive gas species and the exposed Cu-receiving surface, changing the surface characteristics of the exposed Cu-receiving surface to promote the formation of bonds between the Cu-receiving surface and subsequently deposited Cu; and c) depositing CVD Cu on the Cu-receiving surface exposed in step a), whereby Cu adhesion to the diffusion barrier is improved.

2. A method of applying Cu to selected integrated circuit (IC) surfaces, the selected Cu-receiving surfaces being predominately on diffusion barrier material applied to selected regions of the IC, the method comprising the steps of:

a) exposing each selected Cu-receiving surface to a reactive gas species selected from the group consisting of $O_2$, $H_2$, $N_2$, Ar, He, Ne, Kr, Xe, and volatile C compounds selected from the group consisting of CO, $CH_4$, $C_2H_6$, $C_2F_6$, $C_3F_8$, $C_4F_8$, $CHF_3$, $CH_3F$, and $CF_4$;

b) permitting the reactive gas species to interact with molecules of the Cu-receiving surface, whereby higher energy molecular bonds are replaced with lower energy bonds between the reactive gas species and the exposed Cu-receiving surface, changing the surface characteristics of the exposed Cu-receiving surface to promote the formation of bonds between the Cu-receiving surface and subsequently deposited Cu; and c) depositing CVD Cu on the Cu-receiving surface exposed in step a), whereby Cu adhesion to the diffusion barrier is improved.

3. A method of applying Cu to selected integrated circuit (IC) surfaces, the selected Cu-receiving surfaces being predominately on diffusion barrier material applied to selected regions of the IC, the method comprising the steps of:

a) exposing each selected Cu-receiving surface to a $H_2$ and $N_2$ reactive gas species plasma generated from a plasma source, with the percentage of $H_2$ being generally in the range of 5 to 10% of the total volume, whereby the safety of the process step is enhanced with the use of a non-explosive gas mixture;

b) permitting the reactive gas species to interact with molecules of the Cu-receiving surface, whereby higher energy molecular bonds are replaced with lower energy bonds between the reactive gas species and the exposed Cu-receiving surface, changing the surface characteristics of the exposed Cu-receiving surface to promote the formation of bonds between the Cu-receiving surface and subsequently deposited Cu; and c) depositing CVD Cu on the Cu-receiving surface exposed in step a), whereby Cu adhesion to the diffusion barrier is improved.

4. A method of applying Cu to selected integrated circuit (IC) surfaces, the selected Cu-receiving surfaces being predominately on diffusion barrier material applied to selected regions of the IC, wherein selected regions of the IC also include silicon, the method comprising the steps of:

a) exposing each selected Cu-receiving surface to an ionized reactive gas species generated from a direct plasma source having a RF power level of less than approximately 500 watts, whereby the relatively low energy level of the plasma ions minimizes the disruption of silicon crystalline structures;

b) permitting the reactive gas species to interact with molecules of the Cu-receiving surface, whereby higher energy molecular bonds are replaced with lower energy bonds between the reactive gas species and the exposed Cu-receiving surface, changing the surface characteristics of the exposed Cu-receiving surface to promote the formation of bonds between the Cu-receiving surface and subsequently deposited Cu; and c) depositing CVD Cu on the Cu-receiving surface exposed in step a), whereby Cu adhesion to the diffusion barrier is improved.

5. A method of applying Cu to selected integrated circuit (IC) surfaces, the selected Cu-receiving surfaces being predominately on diffusion barrier material applied to selected regions of the IC, the method comprising the steps of:

a) exposing each selected Cu-receiving surface to an ionized reactive gas species selected from the group consisting of $O_2$, $H_2$, $N_2$, Ar, He, Ne, Kr, Xe, and volatile C compounds selected from the group consisting of CO, $CH_4$, $C_2H_6$, $C_2F_6$, $C_3F_8$, $C_4F_8$, $CHF_3$, $CH_3F$, and $CF_4$;

b) permitting the reactive gas species to interact with molecules of the Cu-receiving surface, whereby higher energy molecular bonds are replaced with lower energy bonds between the reactive gas species and the exposed Cu-receiving surface, changing the surface characteristics of the exposed Cu-receiving surface to promote the formation of bonds between the Cu-receiving surface and subsequently deposited Cu; and c) depositing CVD Cu on the Cu-receiving surface exposed in step a), whereby Cu adhesion to the diffusion barrier is improved.

6. A method of applying Cu to selected integrated circuit (IC) surfaces, the selected Cu-receiving surfaces being predominately on diffusion barrier material applied to selected regions of the IC, the method comprising the steps of:

a) exposing each selected Cu-receiving surface to an ionized $H_2$ and $N_2$ reactive gas species plasma, with the percentage of $H_2$ being generally in the range of 5 to 10% of the total volume, whereby the safety of the process step is enhanced with the use of a non-explosive gas mixture;

b) permitting the reactive gas species to interact with molecules of the Cu-receiving surface, whereby higher energy molecular bonds are replaced with lower energy bonds between the reactive gas species and the exposed Cu-receiving surface, changing the surface characteristics of the exposed Cu-receiving surface to promote the formation of bonds between the Cu-receiving surface and subsequently deposited Cu; and c) depositing CVD Cu on the Cu-receiving surface exposed in step a), whereby Cu adhesion to the diffusion barrier is improved.

7. A method as in claim 1 in which the diffusion barrier material is selected from the group consisting of TiN, TiON, TiSiN, TaSiN, TaN, TiW, TiWN, Mo, and WN, whereby Cu is adhered to a Cu-receiving surface which permits electrical communication between the Cu and regions of the IC underlying the Cu-receiving surface.

8. A method of applying Cu to selected integrated circuit (IC) surfaces, the selected Cu-receiving surfaces being predominately on diffusion barrier material selected from the group consisting of BN, $Si_3N_4$, and SiBN, the diffusion barrier material applied to selected regions of the IC, the method comprising the steps of:

a) exposing each selected Cu-receiving surface to a reactive gas species;

b) permitting the reactive gas species to interact with molecules of the Cu-receiving surface, whereby higher energy molecular bonds are replaced with lower energy bonds between the reactive gas species and the exposed Cu-receiving surface, changing the surface characteristics of the exposed Cu-receiving surface to promote the formation of bonds between the Cu-receiving surface and subsequently deposited Cu; and c) depositing CVD Cu on the Cu-receiving surface exposed in step a), whereby Cu is adhered to an electrically insulating Cu-receiving surface.

9. A method of applying Cu to selected integrated circuit (IC) surfaces, the selected Cu-receiving surfaces being predominately on diffusion barrier material applied to selected regions of the IC, the method comprising the steps of:

a) at a substrate temperature of less than approximately 200° C. to protect the silicon crystalline structures of the IC, exposing each selected Cu-receiving surface to a reactive gas species;

b) permitting the reactive gas species to interact with molecules of the Cu-receiving surface, whereby higher energy molecular bonds are replaced with lower energy bonds between the reactive gas species and the exposed Cu-receiving surface, changing the surface characteristics of the exposed Cu-receiving surface to promote the formation of bonds between the Cu-receiving surface and subsequently deposited Cu; and c) depositing CVD Cu on the Cu-receiving surface exposed in step a), whereby Cu adhesion to the diffusion barrier is improved.

10. A method of applying Cu to selected integrated circuit (IC) surfaces, the selected Cu-receiving surfaces being predominately on diffusion barrier material applied to selected regions of the IC, the method comprising the steps of:

a) exposing each selected Cu-receiving surface to a reactive gas species;

b) permitting the reactive gas species to interact with molecules of the Cu-receiving surface, whereby higher energy molecular bonds are replaced with lower energy bonds between the reactive gas species and the exposed Cu-receiving surface, changing the surface characteristics of the exposed Cu-receiving surface to promote the formation of bonds between the Cu-receiving surface and subsequently deposited Cu;

$b_1$) terminating step a) generally within a time interval of less than 60 seconds, whereby the silicon crystalline structures of the IC are protected; and c) depositing CVD Cu on the Cu-receiving surface exposed in step a), whereby Cu adhesion to the diffusion barrier is improved.

11. A method as in claim 1 in which step a) includes generating the reactive gas species from a downstream plasma source, whereby high energy ions are removed from the plasma flow to minimize damage to the IC.

12. A method of applying Cu to selected IC surfaces, the selected Cu-receiving surfaces being predominately on a TiN diffusion barrier material applied to selected regions of the IC, the method comprising the steps of:

a) using a direct plasma source having a RF power level of less than approximately 500 watts to generate a $H_2$ plasma;

b) exposing each selected Cu-receiving surface to the predominately $H_2$ plasma generated in step a), with step b) being performed at a substrate temperature of less than approximately 200°;

c) permitting the reactive gas species of the $H_2$ plasma to interact with molecules of the Cu-receiving surface, whereby higher energy molecular bonds are replaced with lower energy bonds between the reactive gas species and the exposed Cu-receiving surface, changing the surface characteristics of the exposed Cu-receiving surface to promote the formation of bonds between the Cu-receiving surface and subsequently deposited Cu;

d) terminating step b) generally within a time interval of less than 60 seconds; and e) depositing CVD Cu on the Cu-receiving surface exposed in step b), whereby bonding between the Cu and the TiN surface is improved.

\* \* \* \* \*